(12) United States Patent
Venkatraman et al.

(10) Patent No.: US 8,738,940 B2
(45) Date of Patent: May 27, 2014

(54) POWER CONTROLLER FOR SOC POWER GATING APPLICATIONS

(75) Inventors: Ramnath Venkatraman, San Jose, CA (US); Shashidhara S. Bapat, Bangalore (IN); Ruggero Castagnetti, Menlo Park, CA (US)

(73) Assignee: LSI Corporation, Milpitas, CA (US)

( * ) Notice: Subject to any disclaimer, the term of this patent is extended or adjusted under 35 U.S.C. 154(b) by 402 days.

(21) Appl. No.: 13/226,038

(22) Filed: Sep. 6, 2011

(65) Prior Publication Data

US 2013/0057338 A1   Mar. 7, 2013

(51) Int. Cl.
*G06F 1/00* (2006.01)
*H03K 19/00* (2006.01)
*H03K 17/00* (2006.01)

(52) U.S. Cl.
USPC ............ 713/300; 713/330; 326/102; 327/365

(58) Field of Classification Search
CPC ......... H02H 9/00; H02H 9/001; H03K 17/16; H03K 19/0016; G06F 1/32; G06F 1/3206; G06F 1/04
USPC .................... 713/300, 330; 326/102; 327/365
See application file for complete search history.

(56) References Cited

U.S. PATENT DOCUMENTS

| | | | |
|---|---|---|---|
| 5,513,358 A * | 4/1996 | Lundberg et al. | ............. 713/330 |
| 6,037,810 A | 3/2000 | Woodward | |
| 6,188,266 B1 | 2/2001 | Shimoda | |
| 6,882,200 B2 | 4/2005 | Ahsanullah et al. | |
| 7,157,953 B1 * | 1/2007 | Nguyen | ......... 327/291 |
| 7,215,155 B2 | 5/2007 | Won | |
| 7,613,942 B2 | 11/2009 | Fallah et al. | |
| 7,659,746 B2 * | 2/2010 | Chua-Eoan et al. | ............ 326/83 |
| 7,898,278 B2 * | 3/2011 | Flynn et al. | ............. 324/764.01 |
| 8,484,497 B2 * | 7/2013 | Patil et al. | ..................... 713/323 |

OTHER PUBLICATIONS

Abdollahi, Afshin, et al., "A Robust Power Gating Structure and Power Mode Transition Strategy for MTCMOS Design"; IEEE Transactions on Very Large Scale Integration (VLSI) Systems, vol. 15, No. 1, Jan. 2007, p. 80-89.
Calimera, Andrea, et al. "Design of a Flexible Reactivation Cell for Safe Power-Mode transition in Power-Gated Circuits", IEEE Transactions on circuit and Systems-I: Regular Papers, vol. 56, No. 9, Sep. 2009, p. 1979-1993.
Juan, Da-Cheng, et al., "An Efficient Wake-up Strategy Considering Spurious Glitches Phenomenon for Power Grating Designs", IEEE Transactions on Very Large Scale Integration (VLSI) Systems, vol. 18, No. 2, Feb. 2010, p. 246-255.
Howard David, et al., "Power-on Current Control in Sleep Transistor Implementations", IEEE 2006, 4 pages. Kim, Suhwan et al., Reducing Ground-Bounce Noise and Stabilizing the Data-Retention Voltage of Power-Gating Structures, IEEE Transaction on Electron Devices, vol. 55, No. 1, Jan. 2008, p. 197-205.
Kim, Suhwan, et al.; "Understanding and Minimizing Ground Bounce During Mode Transition of Power Gating Structures", ISLPED'03, Aug. 25-27, 2003, p. 22-25.

* cited by examiner

Primary Examiner — Stefan Stoynov

(57) ABSTRACT

A rush-in current controller includes a clock module connected to provide a delayed sleep control signal based on counting a preset number of clock cycles corresponding to an input sleep control signal. Additionally, the rush-in current controller includes a ring oscillator module connected to maintain the delayed sleep control signal based on counting a preset number of ring oscillator cycles corresponding to a virtual power supply line voltage. A method of controlling a rush-in current includes providing a delayed sleep control signal based on counting a preset number of clock cycles corresponding to an input sleep control signal and maintaining the delayed sleep control signal based on counting a preset number of ring oscillator cycles corresponding to a virtual power supply line voltage.

17 Claims, 8 Drawing Sheets

_US 8,738,940 B2_

POWER CONTROLLER FOR SOC POWER GATING APPLICATIONS

TECHNICAL FIELD

This application is directed, in general, to integrated circuit power control and, more specifically, to a rush-in current controller, a method of controlling a rush-in current and a power control system.

BACKGROUND

MTCMOS (multiple threshold CMOS) or power-gating employs a power-mitigation technique for a system-on-chip (SoC) that uses one or more sleep transistors to shut off supply power to certain blocks within the SoC whenever such blocks are desired to be in "standby" or "sleep" mode. Typically transistor switches, such as one or more "header" switches for a VDD supply or one or more "footer" switches for a VSS or ground supply are employed to reduce power dissipation in the circuit. Size and configuration of these header or footer cells and buffers that always remain turned on, is greatly dependent on IC size, required wake-up time and specified tolerable rush-in current characteristics. A variety of different strengths of header or footer cells along with a variety of delay buffers are typically required to support all possible IC applications, which would impose wide-ranging restrictions on wake-up time and rush-in current. Improvements with respect to minimizing the size of the often-customized libraries of cells required to support such wide-ranging restrictions would prove beneficial to the art.

SUMMARY

Embodiments of the present disclosure provide a rush-in current controller, a method of controlling a rush-in current and a power control system.

One aspect the rush-in current controller includes a clock module connected to provide a delayed sleep control signal based on counting a preset number of clock cycles corresponding to an input sleep control signal. Additionally, the rush-in current controller includes a ring oscillator module connected to maintain the delayed sleep control signal based on counting a preset number of ring oscillator cycles corresponding to a virtual power supply line voltage.

In another aspect, the method of controlling a rush-in current includes providing a delayed sleep control signal based on counting a preset number of clock cycles corresponding to an input sleep control signal and maintaining the delayed sleep control signal based on counting a preset number of ring oscillator cycles corresponding to a virtual power supply line voltage.

In yet another aspect, the power control system includes a plurality of switches that is connected between an unswitched power supply and a virtual power supply line and a plurality of buffers that is connected to control a portion of the plurality of switches. The system also includes a rush-in current controller, having a clock module that is connected to provide a delayed sleep control signal for at least one of the plurality of switches or buffers based on counting a preset number of clock cycles after an input sleep control signal and a ring oscillator module that is connected to maintain the delayed sleep control signal based on counting a preset number of ring oscillator cycles corresponding to a virtual power supply line voltage.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION

Reference is now made to the following descriptions taken in conjunction with the accompanying drawings, in which.

DETAILED DESCRIPTION

Embodiments of the present disclosure address rush-in and shutdown currents in power-gated IC designs both during wakeup and sleep operations. They overcome many of the limitations of existing solutions and work within the commonly used framework of "daisy-chained" header or footer switches. More specifically, at a time of wake-up, they operate by monitoring the voltage on the virtual voltage supply line (rail) and waiting to transmit a "wake" control signal (when a sleep control signal becomes false (a logical zero)) along the daisy chain until this virtual voltage reaches a pre-specified value. A "shutdown" control signal (when a sleep control signal becomes true (a logical one)) on the other hand, is transmitted without delay.

Figure 1:
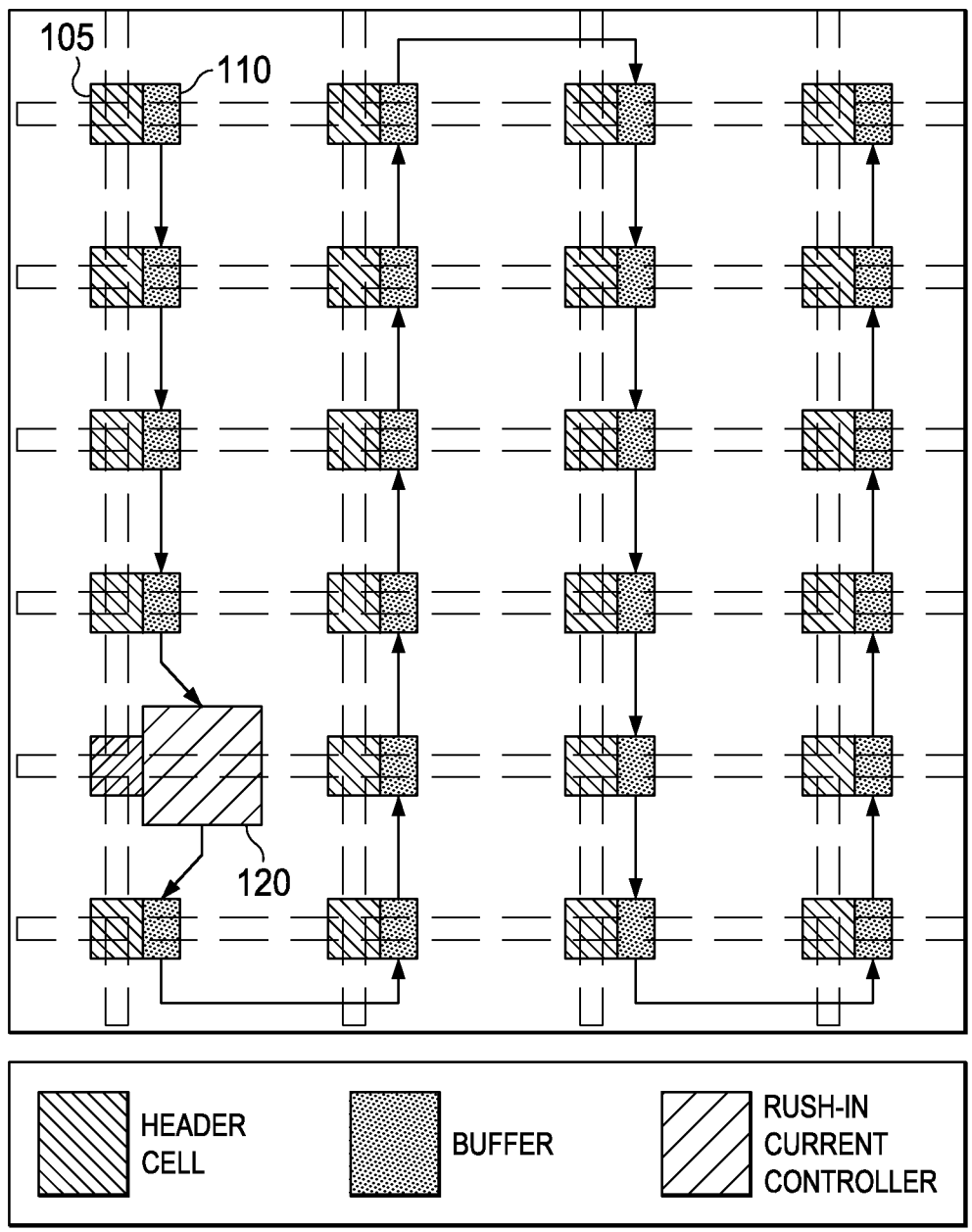
FIG. 1 illustrates a layout of an embodiment of a power control system constructed according to the principles of the present disclosure.

FIG. 1 illustrates a layout of an embodiment of a power control system, generally designated 100, constructed according to the principles of the present disclosure. The layout 100 includes a plurality of switches (header or footer cells) wherein the switch 105 is typical, and a plurality of buffers wherein the buffer 110 is typical. The layout 100 also includes a rush-in current controller 120 that provides control of a rush-in current to a virtual power supply line on the layout 100, during a wake-up mode. For purposes of this disclosure, a rush-in current is defined as a surge of current that occurs in a circuit at the time when the circuit is powered on. Typically in a CMOS circuit, the rush-in current increases rapidly with time when power is turned on and then decreases with time to a value determined by the intrinsic leakage of the circuit.

The plurality of switches is connected between an unswitched power supply (i.e., a power supply that remains turned on) and a virtual power supply line. The plurality of buffers is connected to control a portion of the plurality of switches, and the plurality of buffers is powered from the unswitched power supply. The rush-in current controller 120 makes use of a same clock signal that is used for operation of the circuit. The clock signal serves as a time-reference for operation of the rush-in current controller 120 with this time-reference being independent of the operating voltage. The rush-in current controller 120 also includes a ring oscillator module that is connected to maintain a false condition of a delayed sleep control signal based on counting a preset number of ring oscillator cycles corresponding to a virtual power supply line voltage. The preset number of ring oscillator cycles is provided by a ring oscillator connected to the virtual power supply line voltage.

The basic idea is to use the header or footer switches in conjunction with the rush-in current controller 120, which is typically a small circuit that is embedded within the power-gated IC block and enables turning-on of the switches in two stages. In a first stage, only a limited number of switches are allowed to turn on, and in a second stage, when the voltage on the virtual power supply line reaches a predetermined value.

Figure 2:
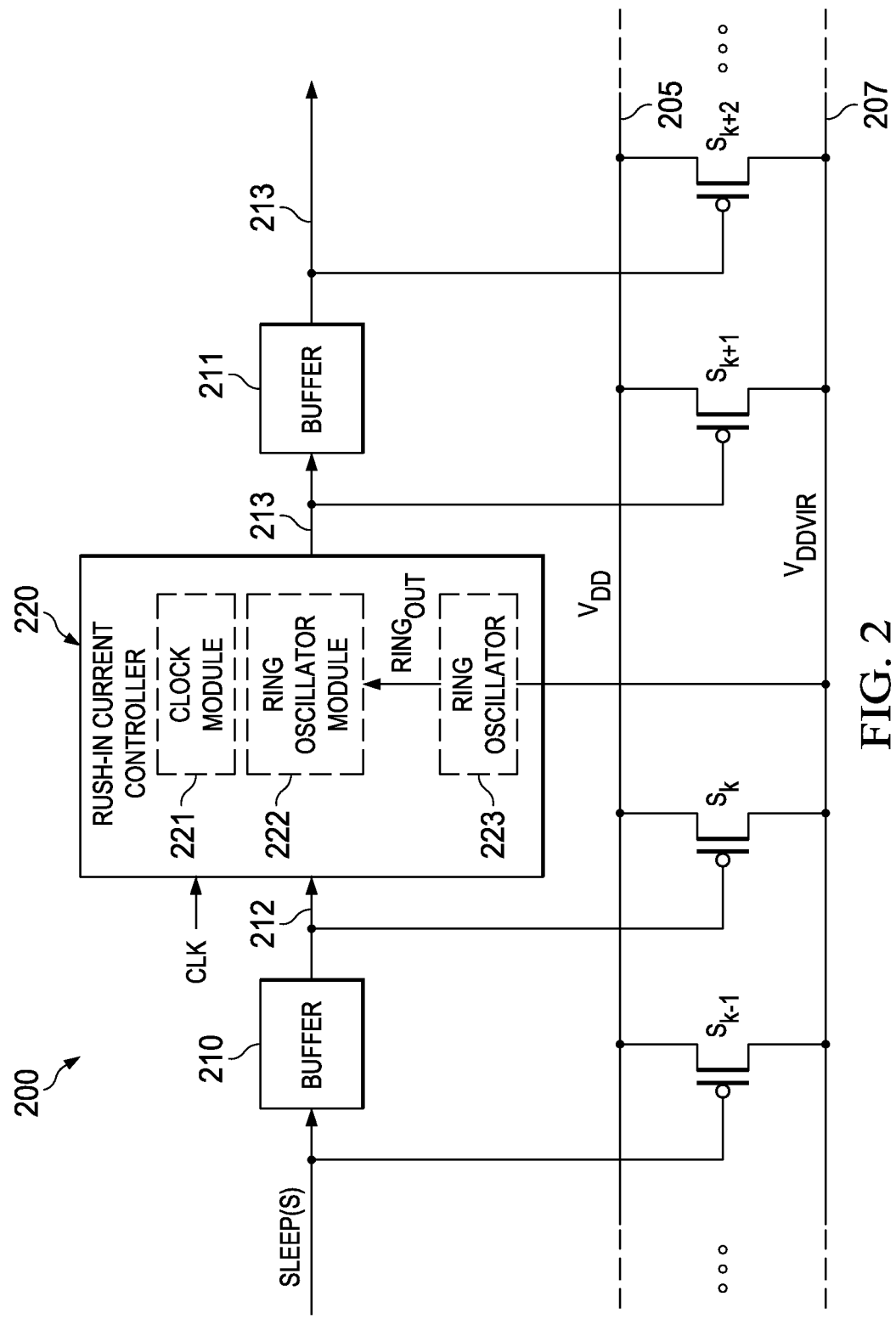
FIG. 2 illustrates a diagram of an embodiment of a power control system constructed according to the principles of the present disclosure.

FIG. 2 illustrates a diagram of an embodiment of a power control system, generally designated 200, constructed according to the principles of the present disclosure. The power control system 200 provides rush-in current control for a virtual power supply line. In the illustrated embodiment, the power control system 200 includes a plurality of switches $S_{k-1}$, $S_k$, $S_{k+1}$, $S_{k+2}$, (header cells in this embodiment) connected between an unswitched supply voltage ($V_{DD}$) on a voltage supply line 205 and a virtual voltage supply line 207 supplying a virtual voltage ($V_{DDVIR}$), as shown. The power control system 200 also includes a plurality of buffers 210, 211 and a rush-in current controller 220. The rush-in current controller 220 includes a clock module 221, a ring oscillator module 222 and a ring oscillator 223, which is powered by the virtual voltage ($V_{DDVIR}$).

A point of insertion of the rush-in current controller 220 within the chain may be mainly dictated by a wake-up time needed. An earlier (upstream) insertion point would mean lower rush-in peak current but larger wake-up time. A more downstream insertion would typically imply higher rush-in current peak. The controller block is responsible for transmitting the sleep control signal through the entire daisy chain.

In a wakeup sequence, a sleep control signal becomes false and is supplied to one end of the daisy chain. That is, it is transmitted along the chain of buffers that are responsible for turning on the header cells, until it reaches the rush-in current controller 220. At this point and after receiving the false sleep control signal, the rush-in current controller 220 starts evaluating the voltage on the virtual voltage supply line 207, which is rising owing to the first few switches having been turned on. The rush-in current controller 220 transmits the false sleep control signal to the next cell in the daisy chain only when the virtual voltage ($V_{DDVIR}$) has reached a certain value.

In other words, the rush-in current controller 220 acts as a voltage sensor, but it is fully digital and is much simpler than traditional analog blocks that might perform the same function. The voltage setting at which the signal is transmitted to the next cell in the daisy chain can be set using a three bit binary code on three configuration pins, which affords up to eight different settings of turn-on voltages. In principle, additional settings of turn-on voltages can be provided using more configuration pins.

Figure 3A:
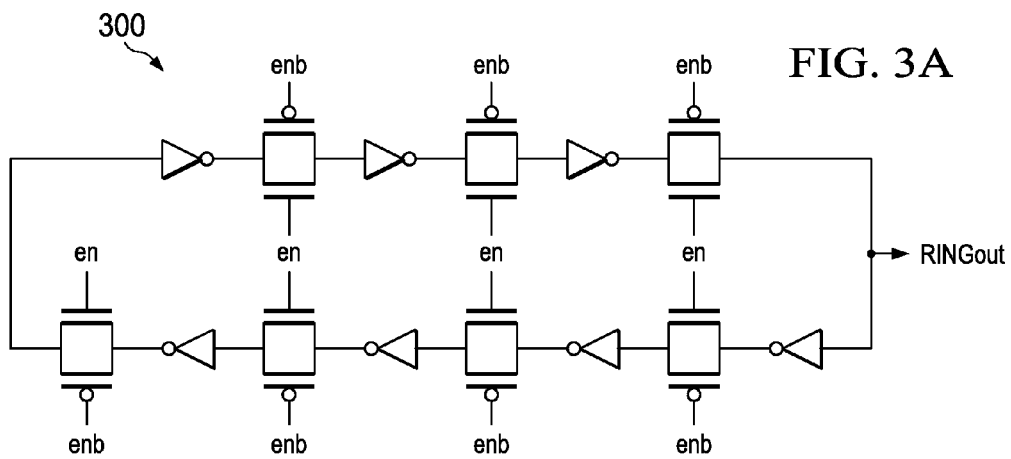
FIGS. 3A and 3B illustrate an example of a ring oscillator as may be employed with a rush-in current controller.
Figure 3B:
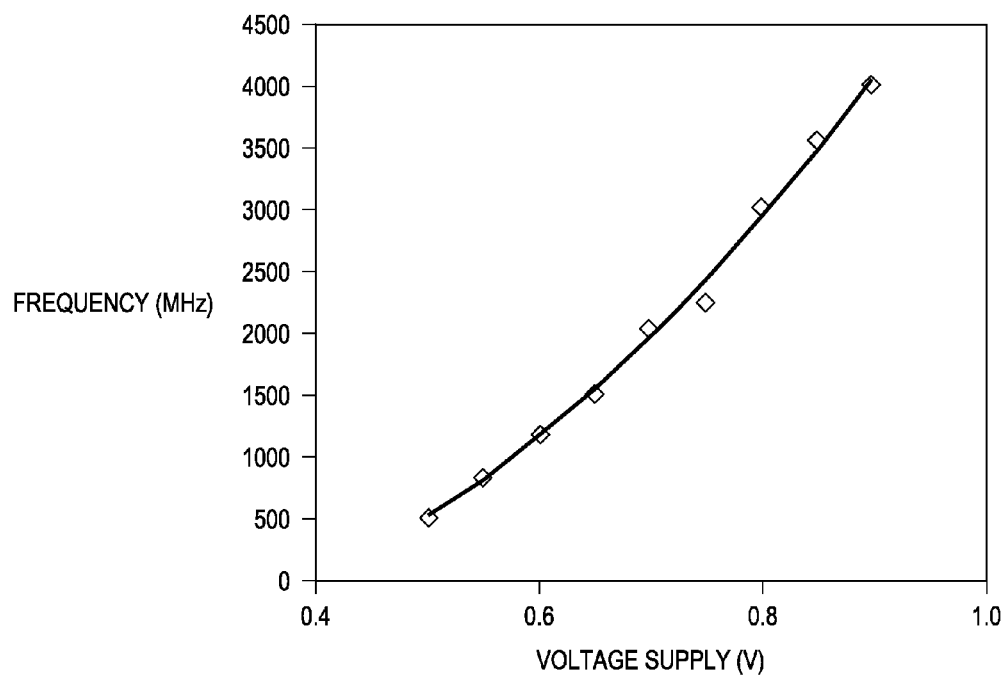

FIGS. 3A and 3B illustrate an example of a ring oscillator, generally designated 300, 320, as may be employed with a rush-in current controller. FIG. 3A shows a block diagram of the ring oscillator 300 and FIG. 3B shows a frequency/voltage transfer curve 320, corresponding to the ring oscillator 300 of FIG. 3A. The presence of the transmission gates within the ring oscillator 300 enables operation to provide a RINGout control signal of the oscillator only when a sleep control signal is false and adds to the reliability of the count. The ring oscillator 300 has a strong frequency dependence, as shown in the frequency/voltage transfer curve 320 of FIG. 3B, where it may be seen that there is roughly an eight times increase in oscillator frequency between a virtual power supply line voltage of 0.5 volts and 0.9 volts.

Figure 4:
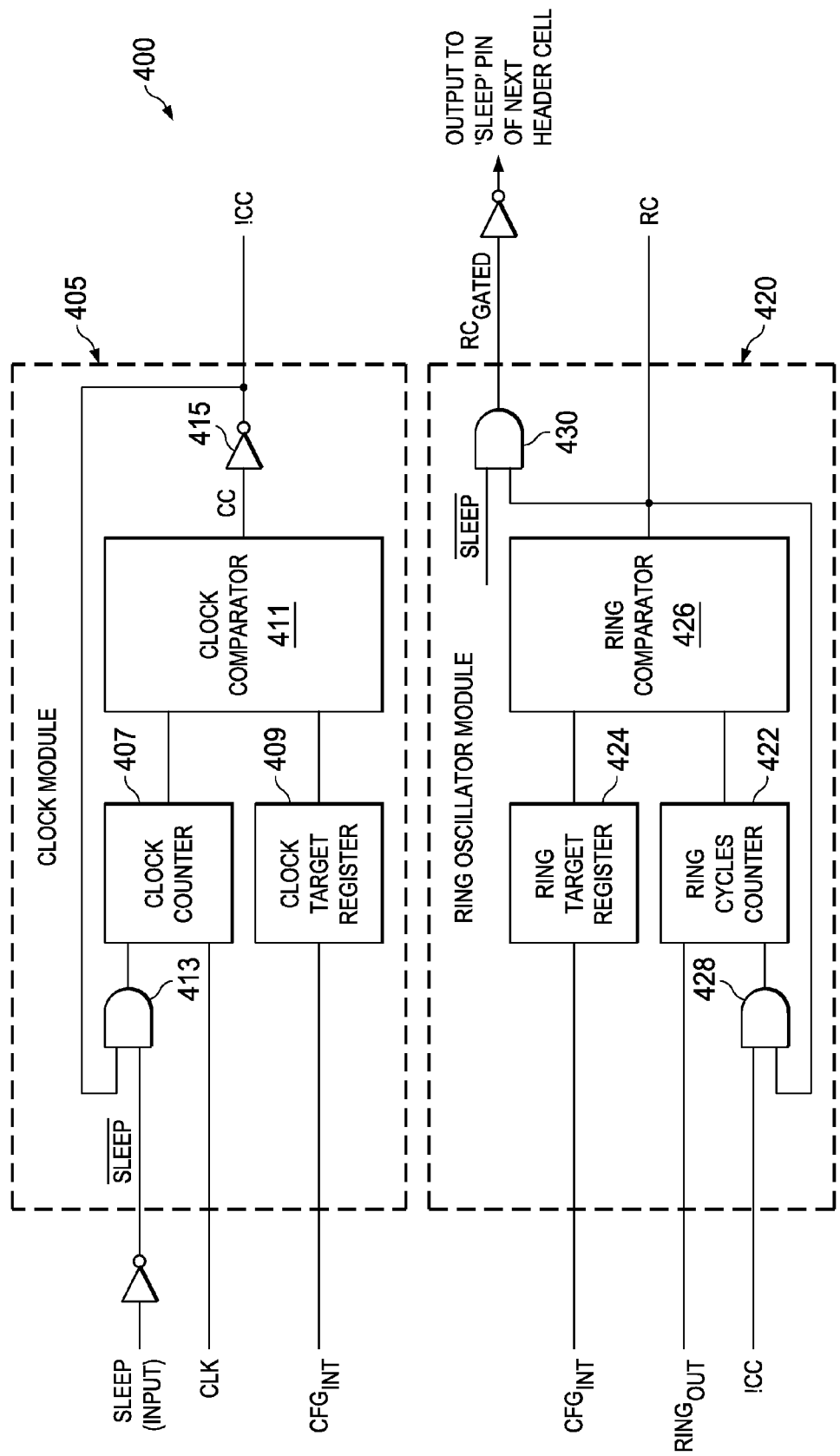
FIG. 4 illustrates a block diagram of an embodiment of a rush-in current controller constructed according to the principles of the present disclosure.

FIG. 4 illustrates a block diagram of an embodiment of a rush-in current controller, generally designated 400, constructed according to the principles of the present disclosure. The rush-in current controller 400 includes a clock module 405 and a ring count module 420 portion. The clock module 405 includes a clock counter 407, a clock target register 409 and a clock comparator 411. The ring counter module 420 includes a ring cycles counter 422, a ring counter register 424 and a ring comparator 426.

The rush-in current controller 400 consists mainly of two configurable and resettable digital counters and a high-speed ring oscillator (oscillating typically at 1-10 GHz) that is attached to a virtual voltage supply line. The clock counter 407 uses a system clock CLK as a time reference and increments itself with every clock cycle. The number of clock cycles to be counted is controlled externally by three input pins designated $CFG_{INT}$. Depending on the state of these three pins, a target value of counts is stored in the clock target register 409.

The clock comparator 411 compares the number of clock cycles counted by the clock counter 407 and the value stored in the clock target register 409. The output CC of the clock comparator 411 is zero if the targeted number of cycles has not been achieved. When the targeted number of cycles is achieved, it changes to one thereby resetting the clock counter 407 (i.e., sets its stored value to zero) through the feedback loop that also contains an AND gate 413. The other input of the AND gate 413 is an inverted (complemented) sleep control signal $\overline{sleep}$.

The other part of the rush-in current controller 400 has the ring cycles counter 422, which has the output of the high-speed ring oscillator RINGout as an input. The operation of this counter is similar to the clock counter 407 described above. At every ring of the ring oscillator, the ring cycles counter 422 increments in value. Similar to the clock target register 409 described above, there is a ring target register 424, which is programmed by the same three input pins $CFG_{INT}$.

The values that the ring target register 424 stores need not be the same as those in clock target register 409 even though they share the same $CFG_{INT}$ input pins. It may be hardcoded and up to the designer to decide at the time of designing an IC. Only when the output CC goes from false to true (posedge CC) or when the inverted sleep control signal $\overline{sleep}$ control signal goes from true to false, the ring comparator 426 compares the value in the ring target register 424 and the ring cycles counter 422 to output a logical zero or false signal if the counter has not reached the targeted count value. Otherwise it outputs a logical one or true signal.

In other words, the ring comparator 426 makes a decision to change value only when the clock counter 407 has completed its count of the specified number of system clock cycles. As described for the clock counter 407, the output of ring comparator 426 is fed back to act as a reset signal for the ring cycles counter 422, which sets its count value to zero. The resetting mechanism for this counter is also decided by the complement output signal !CC that is generated from the clock counter 407 described above through the presence of another AND gate 428.

It may be appreciated that as long as the virtual Vdd voltage stays above a certain threshold, the ring cycles counter 422 will exceed the "target" value at the end of the specified number of external clock cycles and therefore will output a true. The output of the ring comparator 426 is also ANDed through an AND gate 430 with the inverted sleep control signal $\overline{sleep}$ control signal itself so that the output of the AND gate 430 is never falsely equal to a logical one when the inverted sleep control signal $\overline{sleep}$ is equal to a logical zero. Note that the output signal of the wake-up controller (either RC or $RC_{Gated}$ in FIG. 4) is inverted before connecting it to the next stage in the daisy chain.

Figure 5:
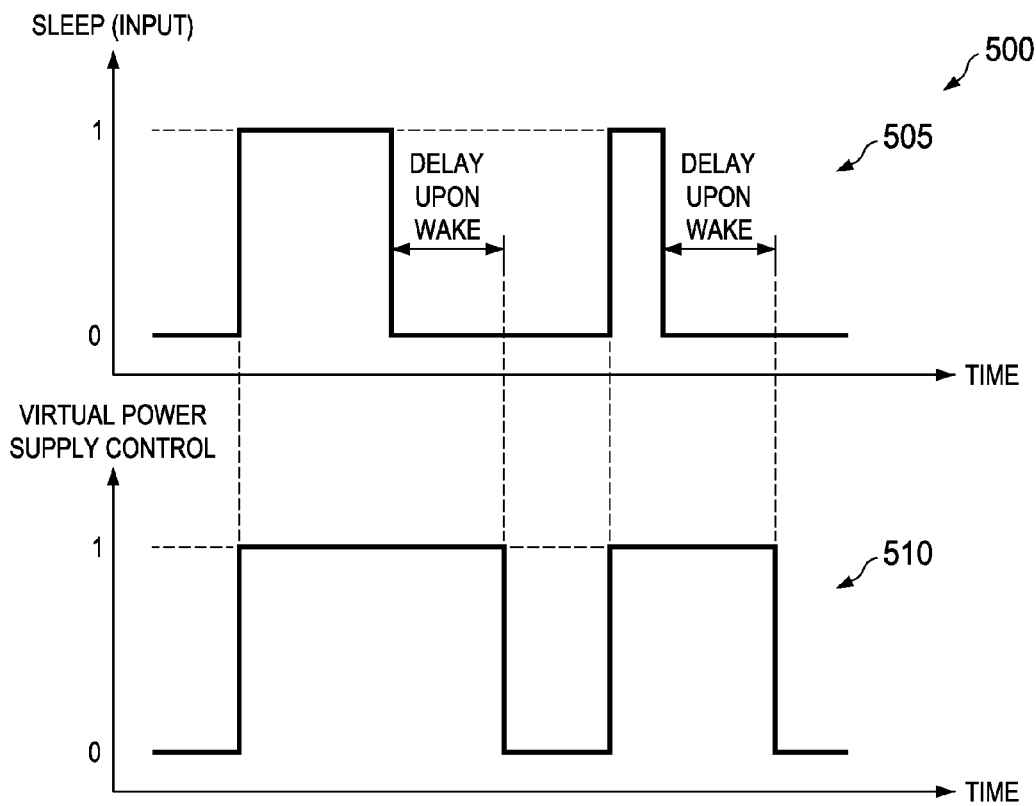
FIG. 5 illustrates waveform diagrams for an embodiment of a power control system employing a rush-in current controller.

FIG. 5 illustrates waveform diagrams for an embodiment of a power control system, generally designated 500, employing a rush-in current controller. The waveforms 500 include a sleep control waveform 505 and a resulting virtual power supply line control 510 for two sleep cycles. It may be seen that the negative edge of the sleep control signal (corresponding to a wake-up cycle) is delayed to its initial downstream buffer thus allowing a virtual voltage profile to be tailored to limit a rush-in current. Alternately, activation of a positive edge of the sleep control signal (corresponding to a shutdown or sleep cycle) causes the virtual voltage profile to return to zero relatively quickly.

Figure 6:
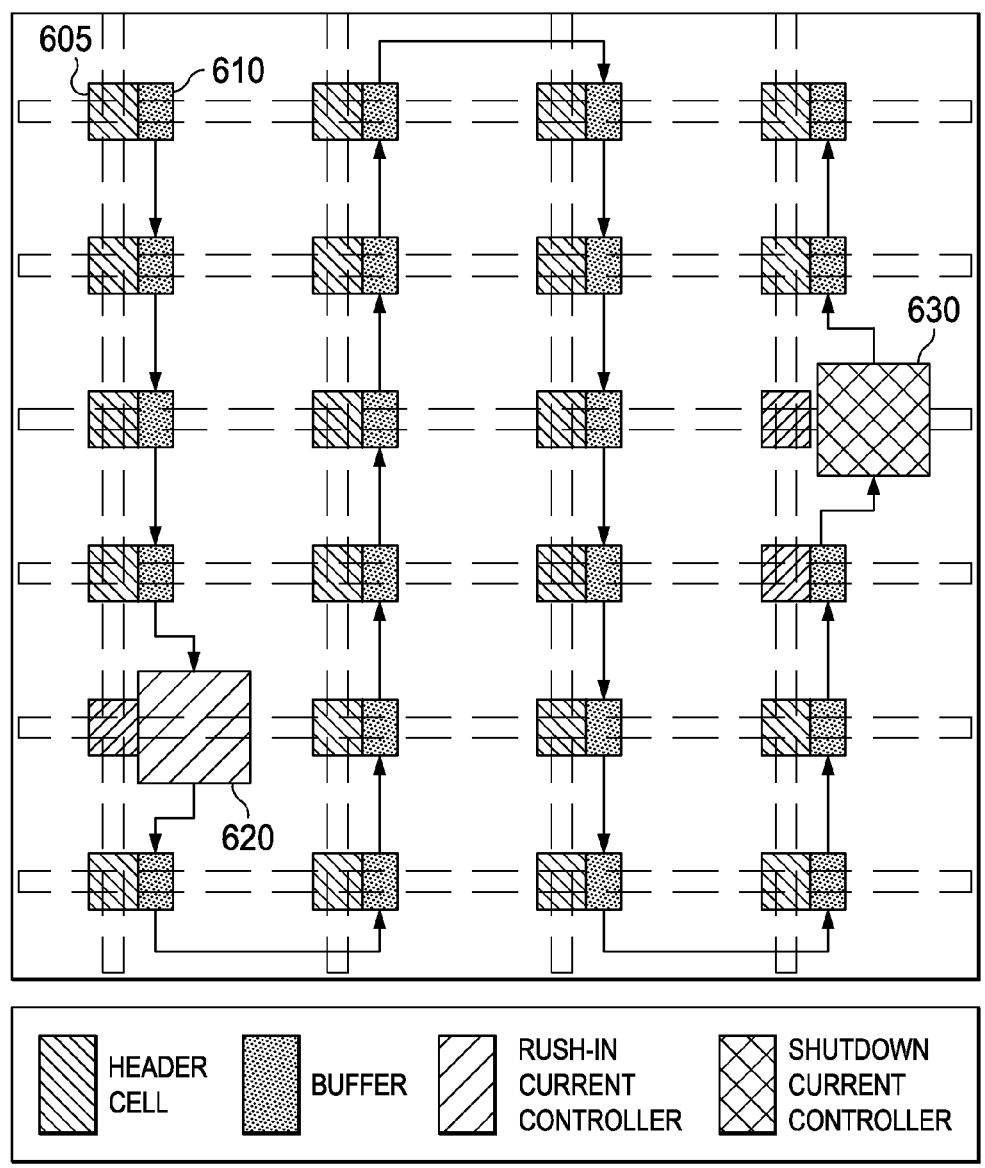
FIG. 6 illustrates a layout of another embodiment of a power control system constructed according to the principles of the present disclosure.

FIG. 6 illustrates a layout of another embodiment of a power control system, generally designated 600, constructed according to the principles of the present disclosure. The layout 600 includes a plurality of switches (header cells) wherein the switch 605 is typical, and a plurality of buffers wherein the buffer 610 is typical. The layout 600 also includes a rush-in current controller 620 that provides control of a rush-in current to a virtual power supply line. In the illustrated embodiment, a shutdown current controller 630 provides a variation for the power control system of FIG. 1.

The shutdown current controller 630 is used in conjunction with a previously described rush-in current controller. A true (i.e., logical one) sleep control signal, sent at the start of the daisy chain, propagates through most of the buffers as well as the wake-up controller and activates the shutdown current controller 630.

Figure 7:
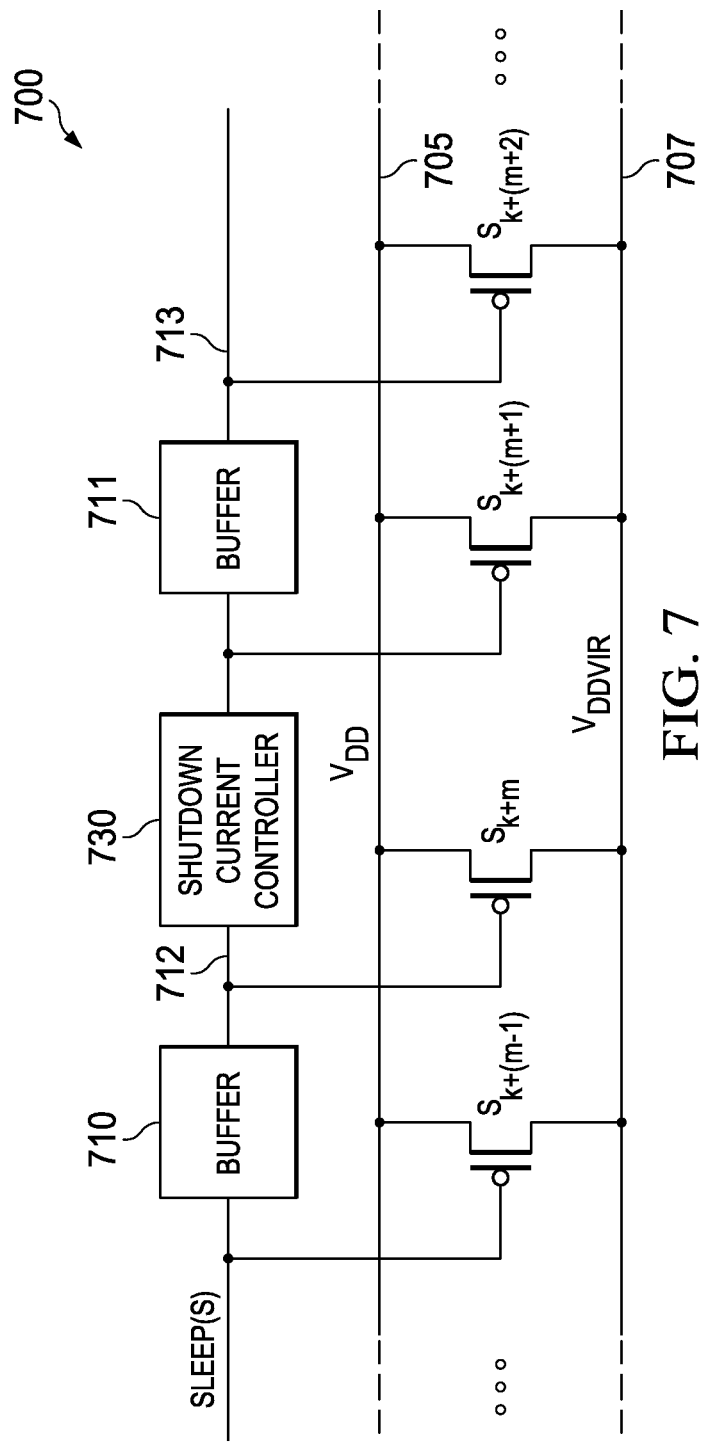
FIG. 7 illustrates a diagram of another embodiment of a power control system constructed according to the principles of the present disclosure.

FIG. 7 illustrates a diagram of another embodiment of a power control system, generally designated 700, constructed according to the principles of the present disclosure. The power control system 700 provides shutdown current control for a virtual power supply line. The power control system 700 may be used as a separate controller or in conjunction with a wake-up rush-in current controller, such as the rush-in current controller 220 in the power control system 200. In the illustrated embodiment, the power control system 700 includes a plurality of switches $S_{k+(m-1)}$, $S_{k+m}$, $S_{k+(m+1)}$, $S_{k+(m+2)}$, connected between an unswitched supply voltage ($V_{DD}$) on a voltage supply line 705 and a virtual voltage supply line 707 supplying a virtual voltage ($V_{DDVIR}$), as shown. The power control system 700 also includes a plurality of buffers 410, 411 and a shutdown current controller 730.

The shutdown current controller 730 may be applied to control current transients during a shutdown operation. The shutdown current controller 730 is placed downstream in the daisy chain as indicated in FIG. 7. As a sleep control signal goes true, the switches in the daisy chain turn off leading to the virtual voltage supply line 707 starting to slowly drop in voltage. The signal is passed on with minimal delay along the chain. When the sleep control signal reaches the shutdown current controller 730, it starts monitoring the dropping voltage on the virtual voltage supply line 707. As a lower predetermined limit is reached, it sends on the sleep control signal to the remaining few header cells that are downstream of it. In this manner both wake-up and sleep can be controlled.

Figure 8:
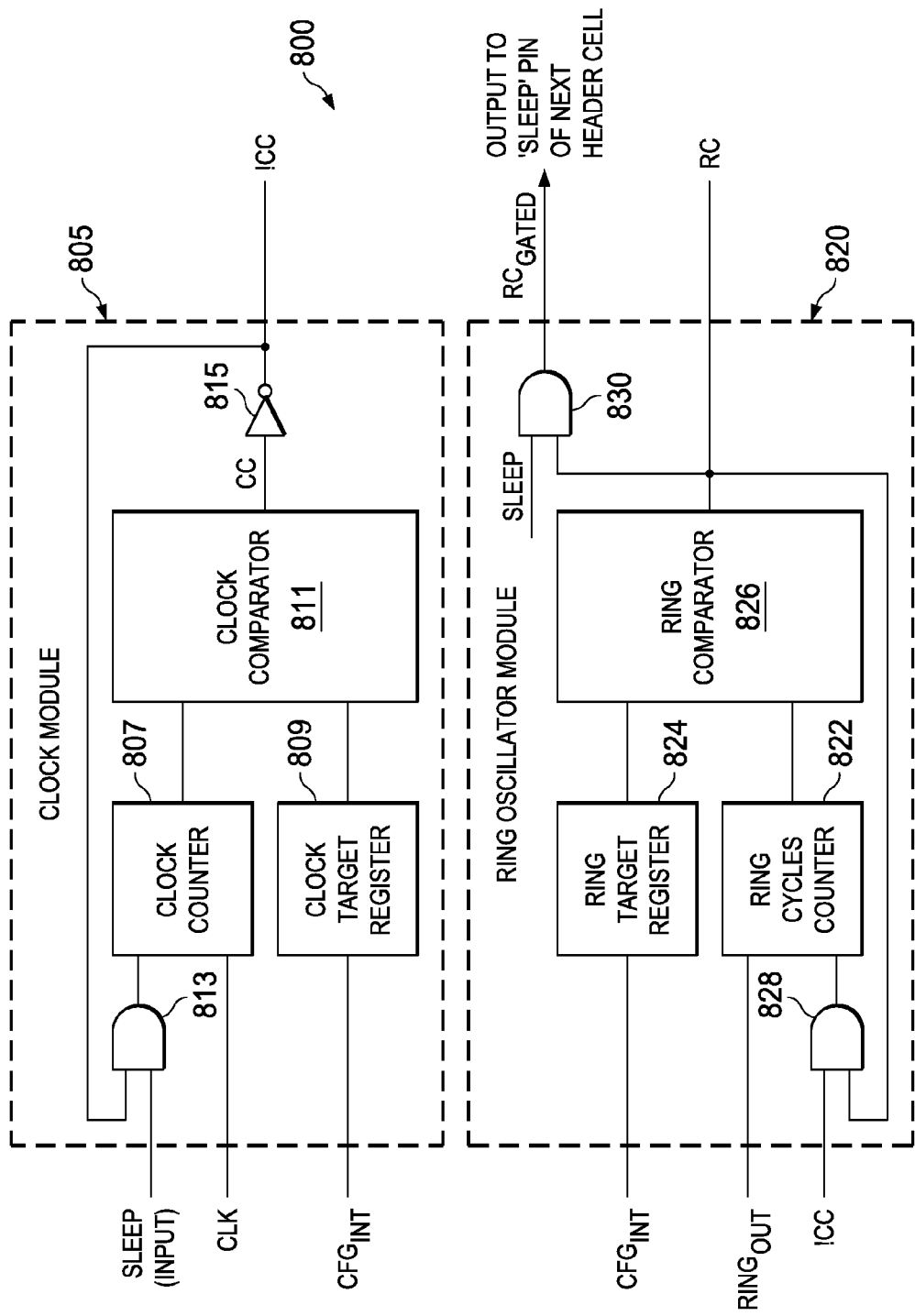
FIG. 8 illustrates a block diagram of an embodiment of a shutdown current controller constructed according to the principles of the present disclosure.

FIG. 8 illustrates a block diagram of an embodiment of a shutdown current controller, generally designated 800, constructed according to the principles of the present disclosure. The shutdown current controller 800 operates in a similar manner to the rush-in current controller 400 of FIG. 4. An input to the shutdown current controller 800 is a sleep control signal shown at two different locations in FIG. 8. The shutdown current controller 800 also has two configurable and resettable digital counters and a high-speed ring oscillator attached to the virtual voltage supply line. A clock comparator portion 811 compares the number of clock cycles counted by a clock counter 807 and the value stored in a clock target register 809. An output CC of the clock comparator 811 is a logical zero if the targeted number of cycles has not been achieved. When the targeted number of cycles is achieved, it changes to a logical one thereby resetting the clock counter 807 to zero through the feedback loop that contains an AND gate 813. The other input of the AND gate 813 is the sleep control signal.

The other part of the shutdown current controller 800 includes a ring cycles counter 822, which has the output of a high-speed ring oscillator RINGout as an input. The operation of this counter is similar to the clock counter 807 described above. A ring cycles counter 822 increments in value at every ring of the ring oscillator. There is a ring target register 824, which is programmed by three input pins $CFG_{INT}$. The output of a ring comparator 826 is designed to only change value either when the clock counter 807 has completed its count of system clock cycles or when the sleep control signal transitions from one to zero. Note here that the ring comparator 826 outputs a logical zero if the ring comparator 826 has reached or exceeded its targeted value (indicating that the virtual voltage is still too high for propagating a true (logical one) sleep control signal. Only when the value of the ring cycles counter 822 drops below the targeted value is a logical one outputted thereby allowing the remainder of the header cells in the daisy chain to also turn off.

Figure 9:
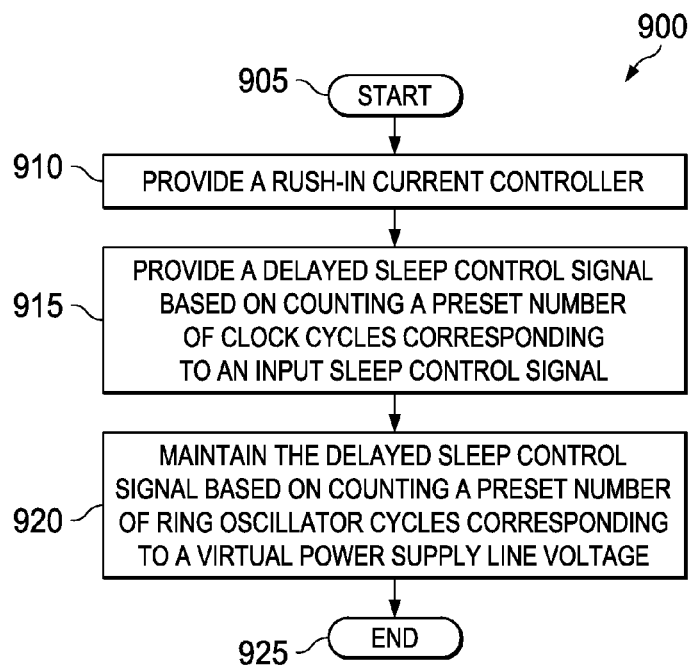
FIG. 9 illustrates a flow diagram of a method of controlling a rush-in current carried out according to the principles of the present disclosure.

FIG. 9 illustrates a flow diagram of a method of controlling and rush-in current, generally designated 900, carried out according to the principles of the present disclosure. The method 900 starts in a step 905 and a rush-in controller is provided in a step 910. Then a delayed sleep control signal is provided based on counting a preset number of clock cycles corresponding to an input sleep control signal, in a step 915. The delayed sleep control signal is maintained based on counting a preset number of ring oscillator cycles corresponding to a virtual power supply line voltage, in a step 920.

In one embodiment, the preset number of clock cycles is provided by counting system clock cycles. In another embodiment, the preset number of ring oscillator cycles is provided by a ring oscillator connected to the virtual power supply line voltage. Additionally, the preset number of clock cycles or the preset number of ring oscillator cycles is controlled externally by a three bit digital control word. The method 900 ends in a step 925.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

Those skilled in the art to which this application relates will appreciate that other and further additions, deletions, substitutions and modifications may be made to the described embodiments.

What is claimed is:

1. A rush-in current controller, comprising:
   a clock module connected to provide a delayed sleep control signal based on counting a preset number of clock cycles and corresponding to an input sleep control signal; and
   a ring oscillator module connected to maintain the delayed sleep control signal based on counting a preset number of ring oscillator cycles corresponding to a virtual power supply line voltage.

2. The controller as recited in claim 1 wherein the preset number of clock cycles is provided by counting system clock cycles.

3. The controller as recited in claim 1 wherein the preset number of clock cycles is controlled externally by a three bit digital control word.

4. The controller as recited in claim 1 wherein the preset number of ring oscillator cycles is provided by a ring oscillator connected to the virtual power supply line voltage.

5. The controller as recited in claim 1 wherein the preset number of ring oscillator cycles is controlled externally by a three bit digital control word.

6. A method of controlling a rush-in current, comprising:
   providing a delayed sleep control signal based on counting a preset number of clock cycles corresponding to an input sleep control signal; and
   maintaining the delayed sleep control signal based on counting a preset number of ring oscillator cycles corresponding to a virtual power supply line voltage.

7. The method as recited in claim 6 wherein the preset number of clock cycles is provided by counting system clock cycles.

8. The method as recited in claim 6 wherein the preset number of clock cycles is controlled externally by a three bit digital control word.

9. The method as recited in claim 6 wherein the preset number of ring oscillator cycles is provided by a ring oscillator connected to the virtual power supply line voltage.

10. The method as recited in claim 6 wherein the preset number of ring oscillator cycles is controlled externally by a three bit digital control word.

11. A power control system, comprising:
    a plurality of switches that are connected between an unswitched power supply and a virtual power supply line;
    a plurality of buffers that are connected to control a portion of the plurality of switches; and
    a rush-in current controller, including:
      a clock module that is connected to provide a delayed sleep control signal for at least one of the plurality of switches or buffers based on counting a preset number of clock cycles after an input sleep control signal; and
      a ring oscillator module that is connected to maintain the delayed sleep control signal based on counting a preset number of ring oscillator cycles corresponding to a virtual power supply line voltage.

12. The system as recited in claim 11 wherein the preset number of clock cycles is provided by counting system clock cycles.

13. The system as recited in claim 11 wherein the preset number of clock cycles is controlled externally by a three bit digital control word.

14. The system as recited in claim 11 wherein the preset number of ring oscillator cycles is provided by a ring oscillator connected to the virtual power supply line voltage.

15. The system as recited in claim 11 wherein the preset number of ring oscillator cycles is controlled externally by a three bit digital control word.

16. The system as recited in claim 11 further including a shutdown current controller that is connected to control a shutdown current for a portion of the virtual power supply line following an input sleep control signal.

17. The system as recited in claim 16 wherein the shutdown current is dependent on a voltage remaining on the portion of the virtual power supply line.

* * * * *